US008060770B2

(12) United States Patent
Kuzmin et al.

(10) Patent No.: US 8,060,770 B2
(45) Date of Patent: Nov. 15, 2011

(54) METHOD AND SYSTEM FOR CLOCK SKEW REDUCTION IN CLOCK TREES

(75) Inventors: Dan Kuzmin, Givat Shmuel (IL); Michael Priel, Hertzelia (IL); Michael Zimin, Kiryat Bialik (IL)

(73) Assignee: Freescale Semiconductor, Inc., Austin, TX (US)

( * ) Notice: Subject to any disclaimer, the term of this patent is extended or adjusted under 35 U.S.C. 154(b) by 736 days.

(21) Appl. No.: 12/092,464

(22) PCT Filed: Nov. 2, 2005

(86) PCT No.: PCT/IB2005/053582
§ 371 (c)(1),
(2), (4) Date: May 2, 2008

(87) PCT Pub. No.: WO2007/052091
PCT Pub. Date: May 10, 2007

(65) Prior Publication Data
US 2008/0294927 A1    Nov. 27, 2008

(51) Int. Cl.
*G06F 1/12* (2006.01)
(52) U.S. Cl. ........................................ 713/401; 713/503
(58) Field of Classification Search .................. 713/401, 713/503; 702/79, 125
See application file for complete search history.

(56) References Cited

U.S. PATENT DOCUMENTS

| | | | | |
|---|---|---|---|---|
| 4,924,430 A | * | 5/1990 | Zasio et al. | 716/108 |
| 5,204,559 A | * | 4/1993 | Deyhimy et al. | 327/232 |
| 5,428,311 A | * | 6/1995 | McClure | 327/276 |
| 5,570,045 A | * | 10/1996 | Erdal et al. | 326/93 |
| 6,192,092 B1 | * | 2/2001 | Dizon et al. | 375/371 |
| 6,711,716 B1 | | 3/2004 | Mueller et al. | |
| 6,741,122 B2 | | 5/2004 | Kapoor et al. | |
| 6,757,204 B2 | * | 6/2004 | Di Ronza et al. | 365/200 |
| 6,941,532 B2 | | 9/2005 | Haritsa et al. | |
| 6,943,610 B2 | | 9/2005 | Saint-Laurent | |
| 6,957,357 B2 | | 10/2005 | Liu et al. | |
| 7,277,808 B1 | * | 10/2007 | Damodaran et al. | 702/79 |
| 7,286,000 B1 | * | 10/2007 | Koo | 327/276 |
| 7,486,126 B2 | * | 2/2009 | Shimazaki | 327/295 |
| 7,573,762 B2 | * | 8/2009 | Kenkare et al. | 365/200 |

(Continued)

OTHER PUBLICATIONS

Tam et al; "Clock generation and Distribution for the 130-nm Itanium 2 Processor with 6-Mb On-Die L3 Cache"; IEEE Journal of Soli-State Circuits, vol. 39, No. 4, Apr. 2004.

(Continued)

*Primary Examiner* — Khanh Dang

(57) ABSTRACT

A system that includes a clock tree and multiple variable delay components. The system is characterized by including a first set of fuses indicative of identities of variable delay components that belong to a first set of variable delay components, a second set of fuses indicative of delay values of the variable delay components that belong to the first set of variable delay components, and a second set of variable delay components that are set to at least one default delay value. A method for reducing clock skews, the method includes providing a clock tree that includes a set of variable delay components. The method is characterized by selecting a first set of variable delay components in view of timing violations occurring due clock skews, setting delay values of variable delay components that form a first set of variable delay components by programming fuses, and setting delay values of variable delay components that form a second set of variable delay components to at least one default value.

18 Claims, 7 Drawing Sheets

U.S. PATENT DOCUMENTS

| | | |
|---|---|---|
| 2002/0196067 A1 | 12/2002 | Schultz |
| 2003/0011417 A1* | 1/2003 | Chung et al. .................. 327/277 |
| 2003/0048122 A1 | 3/2003 | Kazi |
| 2003/0101423 A1 | 5/2003 | Thorp et al. |
| 2004/0128634 A1 | 7/2004 | Johnson et al. |
| 2004/0181705 A1 | 9/2004 | Gauthier et al. |
| 2005/0102643 A1 | 5/2005 | Hou et al. |
| 2005/0107970 A1 | 5/2005 | Franch et al. |
| 2009/0201059 A1* | 8/2009 | Osborne ....................... 327/158 |

OTHER PUBLICATIONS

Velenis et al; "Reduced Delay Uncertainty in High Performance Clock Distribution Networks"; Proceedings of the Design, Automation and Test in Europe Conference and Exhibition (Date'03).

Elboim et al; "A Clock-Tuning Circuit for System-on-Chip"; IEEE Transactions on Very Large Scale Integration (VLSI) Systems, vol. 11, No. 4, Aug. 2003.

* cited by examiner

METHOD AND SYSTEM FOR CLOCK SKEW REDUCTION IN CLOCK TREES

FIELD OF THE INVENTION

The present invention relates to methods and systems for reducing clock skew, especially after the production of an integrated circuit is completed.

BACKGROUND OF THE INVENTION

Most integrated circuits include many synchronized components. These synchronized components can include logic gates, inverters, flip-flops, memory cells and the like. Synchronized components are triggered by a clock signal. The clock signals are distributed among the synchronized components using clock distribution networks (also referred to as clock trees).

A typical clock tree includes multiple clock tree branches and multiple clock tree taps. Each clock tree branch splits to multiple clock tree taps. Clock signals propagate along a common clock path and then propagate along non-common clock paths. The non-common clock paths can include passive and optionally active components that can have different characteristics. These components can introduce clock skews. Clock skews can cause timing violations such as setup violations and/or hold violations.

There are multiple prior art methods and systems for reducing clock skews and for measuring clock skews. Some clock skew reduction methods are implemented during the design stages of the integrated circuit while other techniques can be implemented after production. A first method involved optimizing the topology of the clock tree. This method can include designing balanced clock trees and the like. Another clock skew reduction method involves clock reversing. Yet another clock skew reduction method included introducing delays in a large number of clock tree branches. The following articles, patents and patent applications illustrate various clock skew reduction methods and systems: "Reduced delay uncertainty in high performance clock distribution networks", D. Velenis, M. C. Papaefthymiou, E. G. Friedman, Proceedings of the Design, Automation and Test in Europe Conference and Exhibition (DATE '03) 1530-1591/03; "Clock generation and distribution for the 130-nm Itanium® processor with 6-MB on-die L3 cache", S. Tam, R. D. Limaye, U. N. Desai, IEEE journal on solid-state circuits, vol. 39, no. 4, April 2004; U.S. patent application publication Ser. No. 2004/0128634 of Johnson et al.; U.S. patent application publication Ser. No. 2005/0107970 of Franch et al.; U.S. patent application publication Ser. No. 2005/0102643 of Hou, et al.; U.S. patent application publication Ser. No. 2003/0101423 of Thorp, et al.; U.S. patent application publication Ser. No. 2004/0181705 of Gauthier, et al.; U.S. patent application publication Ser. No. 2002/0196067 of Schultz; U.S. Pat. No. 6,957,357 of Liu; U.S. Pat. No. 6,943,610 of Saint-Laurent; U.S. Pat. No. 6,941,532 of Haritsa et al. and U.S. Pat. No. 6,741,122 of Kapoo.

There is a need to provide efficient systems and methods for reducing clock skew.

SUMMARY OF THE PRESENT INVENTION

A system and a method for clock skew reduction, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENT

According to an embodiment of the invention a system and method for reducing clock skews after production are provided.

According to an embodiment of the invention a system having clock skew reduction capabilities is provided. The system includes a clock tree, multiple variable delay components, a first set of fuses indicative of identities of variable delay components that belong to a first set of variable delay components, a second set of fuses indicative of delay values of the variable delay components that belong to the first set of variable delay components, and a second set of variable delay components that are set to at least one default delay value.

The first set of variable delay components can be selected in view of various timing related tests of the device, and especially of operational paths that include components that receive different clock signals from different edges of the clock tree. The system can include test paths that facilitate a determination of timing margins associated with operational paths. These timing margins as well as timing differences between different clock signals define which variable delay components belong to the first set of variable delay components.

Conveniently, the number of fuses required to allow an integrated circuit to operate properly is relatively limited, especially in relation to an amount of fuses that should be required to set each and every variable delay unit.

According to an embodiment of the invention a method for reducing clock skews is provided. The method includes: (i) providing a clock tree that includes a set of variable delay components, (ii) selecting a first set of variable delay components in view of timing violations occurring due clock skews, (iii) setting delay values of variable delay components that form a first set of variable delay components by programming fuses, and (iv) setting delay values of variable delay components that form a second set of variable delay components to at least one default value.

According to an embodiment of the invention a method for reducing clock skews is provided. The method includes: (i) providing a clock tree that comprises a set of variable delay components; (ii) setting delay values of variable delay components that form a first set of variable delay components by programming fuses; (iii) and (iv) setting delay values of variable delay components that form a second set of variable delay components to at least one default value. Conveniently, whereas the first set is smaller than one half of the second set.

Figure 1:
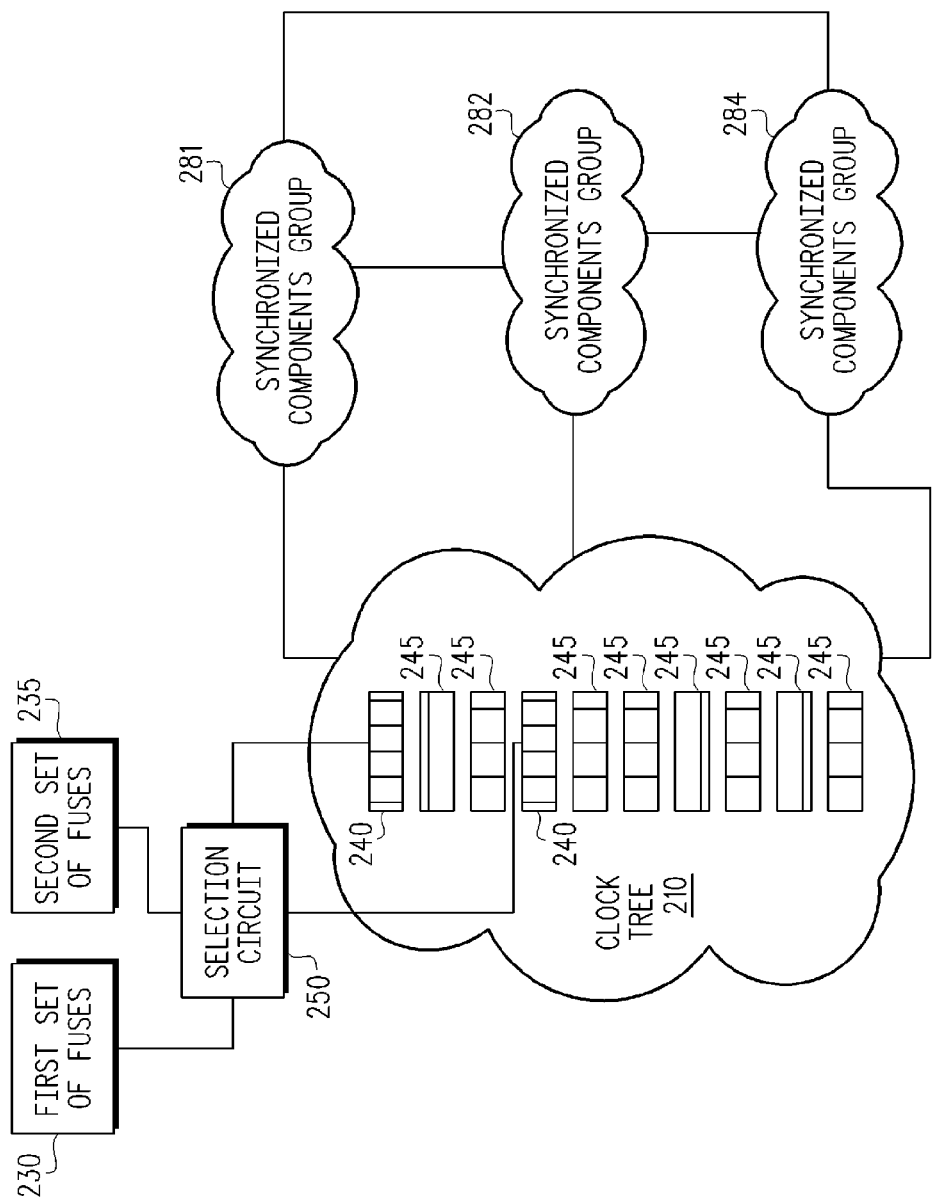
FIG. 1 is a schematic diagram of a system, according to an embodiment of the invention.

FIG. 1 illustrates a system 200, according to an embodiment of the invention. System 200 can include one or more integrated circuits, can include one or more voltage supply units, can be a mobile system such as but not limited to a cellular phone, a laptop computer, a personal data accessory and the like.

System 200 includes a clock tree 210, a first set of fuses 230, a second set of fuses 235, a selection circuit 250, a first set of variable delay components 240, a second set variable delay components 245 and multiple synchronized component groups 281-282 and 284.

The clock tree 210 includes multiple variable delay components 240 and 245. Conveniently, the number of variable delay components is very large and can conveniently exceed few hundreds. The number of variable delay components can also exceed one thousand.

The inventors found that even if a system includes a large number of variable delay components then only few variable delay components should be adjusted in order to provide a functional system. The system is tested in order to select which variable delay components should be set to a delay value other then their default delay value. These delay values can be determined by programming fuses.

By setting only a small portion of the multiple variable delay components, the number of fuses can be relatively small. In addition, the delay value of the selected variable delay components can be defined with relatively high resolution, as many fuses can be allocated per each selected variable delay component.

For example, assuming that there are three hundred 4-bit variable delay components. If each delay unit is set by four fuses then one thousand and two hundred fuses were required. If, for example, only ten adjustable delay components are selected and set to a value that differs from their default value then ninety fuses are required to identify each of these ten selected variable delay units (nine fuses per selected variable delay unit), and forty additional bits are required for setting the ten delay values of the ten selected variable delay components.

Referring to FIG. 1, The selection circuit 250 is connected to the first set of fuses 230, to the second set of fuses 235 and to each of the variable delay components within the clock tree 210. For simplicity of explanation the selection circuit 210 is illustrated as being connected to two variable delay components that form a first set of variable delay components 240. It is noted that the number of variable delay components that form the first set of variable delay components can exceed (and even well exceed) two.

According to an embodiment of the invention, most of the variable delay components are set to provide a default delay value. Conveniently, the first set of variable delay components 240 is smaller than half of the second set of variable delay components 245. Conveniently, the first set of variable delay components 240 is smaller than one sixth of the second set of variable delay components 245. The inventors used a 1:29 ratio between these two sets.

The clock tree 210 provides a first clock signal to synchronized components group 281. The clock tree 210 provides another clock signal to synchronized components group 282. The clock tree 210 provides a further clock signal to synchronized components group 284. Each one of the synchronized components groups 281, 282 and 284 can include one or more latches, transistors, flip-flops, and the like.

Synchronized components groups 281, 282 and 284 are connected to each other and define multiple operational paths. The functionality of the operational paths can be hampered due to clock skews. By adjusting some variable delay components within clock tree 210 these clock skews can be reduced.

Conveniently, the first set of fuses 230 are indicative of the identities of variable delay components that belong to the first set of variable delay components 240. The second set of fuses 235 are indicative of the delay values of the variable delay components that belong to the first set of variable delay components.

The selection circuit 250 sends to each variable delay component that belongs to the first set of variable delay components 240 a delay value that determines the delay of that variable delay component.

Conveniently, the second set of variable delay components 245 are set to at least one default delay value.

Figure 2:
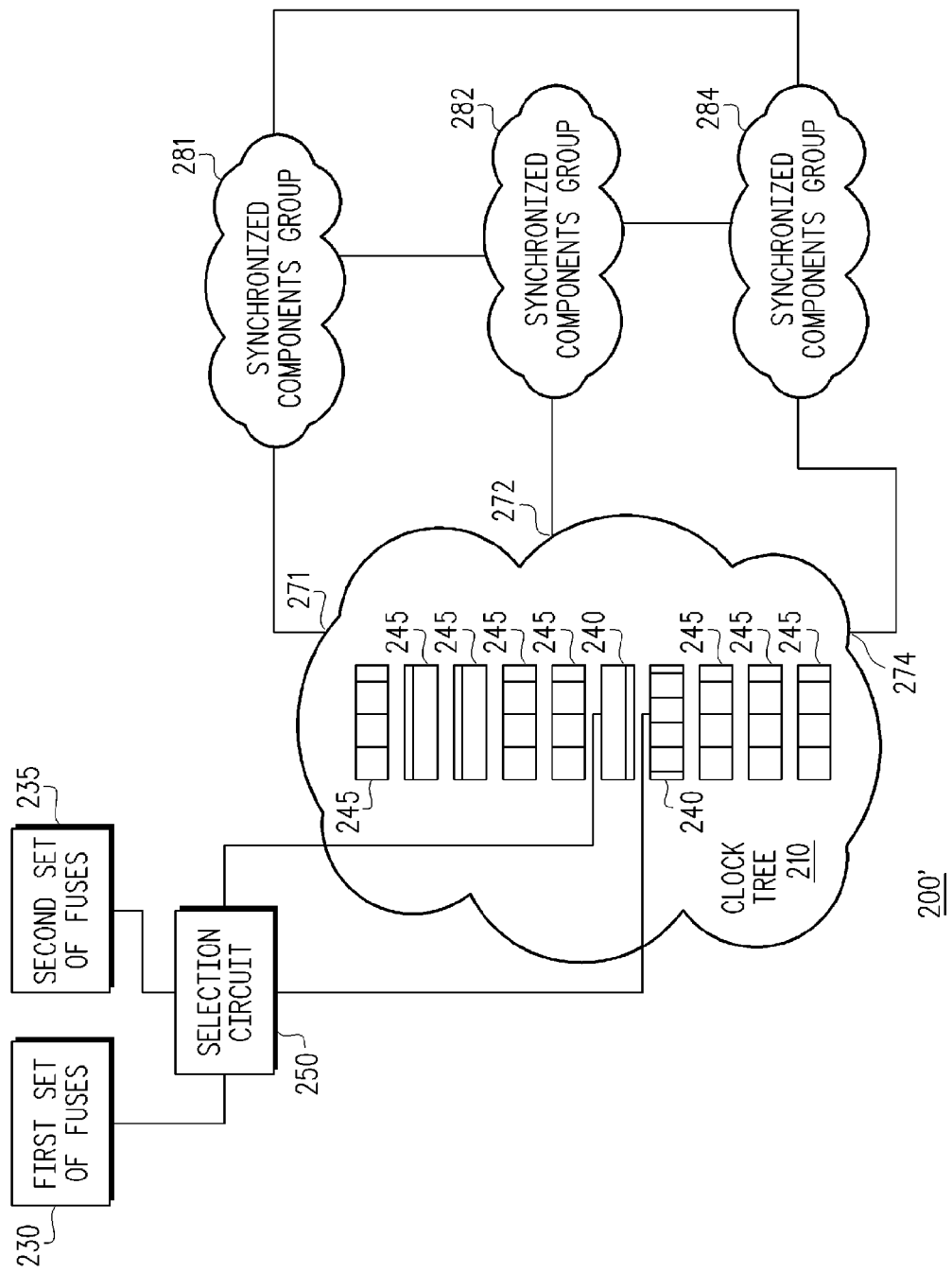
FIG. 2 is a schematic diagram of a system, according to an embodiment of the invention.

FIG. 2 is a schematic diagram of system 200', according to an embodiment of the invention.

System 200' of FIG. 2 resembles system 200 of FIG. 1 but differs by the selection of variable delay components. In other words, system 200 was tested and certain variable delay components were selected to be set to a delay value that differs from their corresponding default delay values. System 200' was tested and other delay components were selected.

Figure 3:
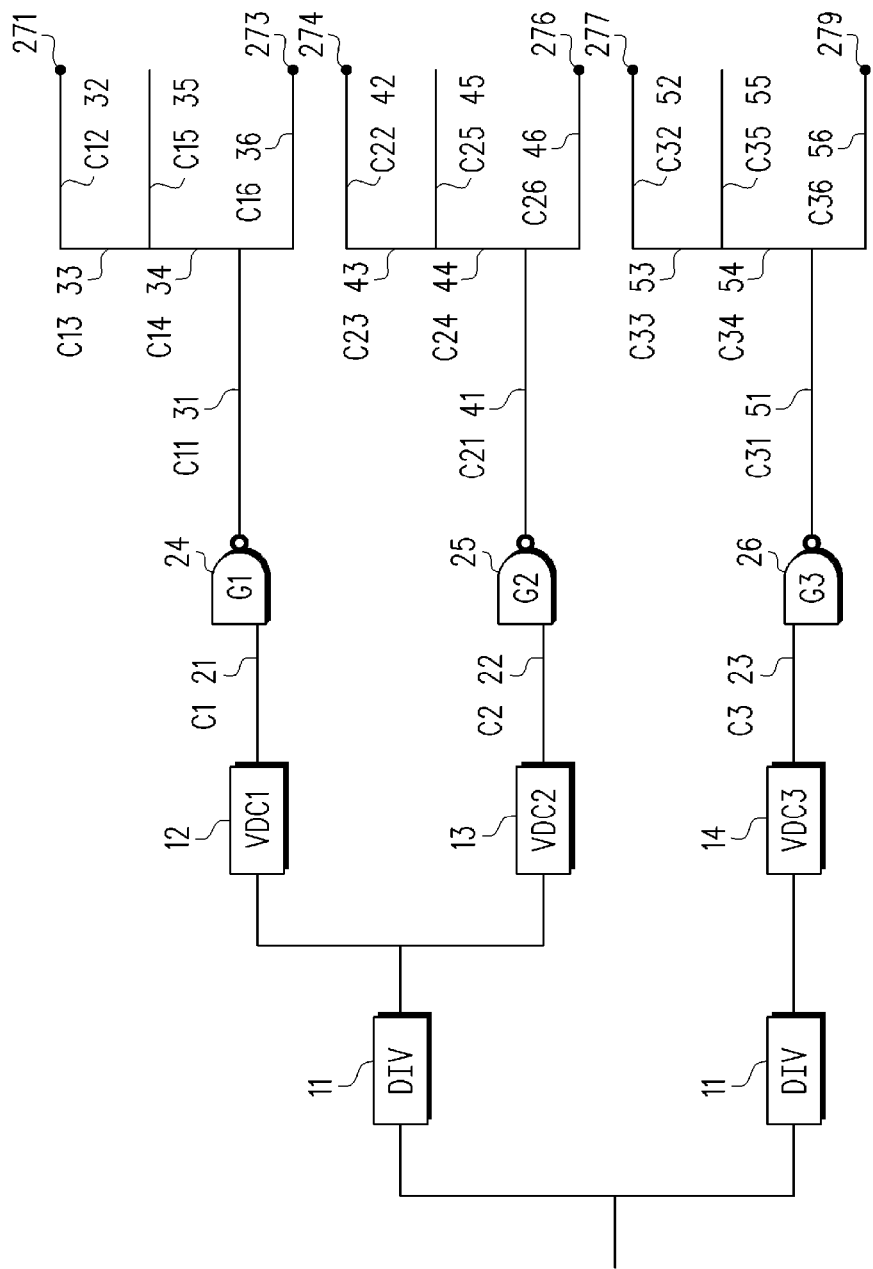
FIG. 3 is a schematic diagram of a portion of a clock tree, according to an embodiment of the invention.

FIG. 3 is a schematic diagram of a portion 211 of clock tree 210, according to an embodiment of the invention.

Those of skill in the art will appreciate that the invention can be applied to clock tree portions that have different structures, as well as to clock tree portions that include other components (such as buffers, repeaters, drivers) as well as to clock trees that include fewer components.

Portion 211 is connected, either directly or indirectly, to a clock signal generator (not shown). At the root of portion 211 the clock signal is split to two clock paths and is provided to two clock dividers 11 and 11'. The first clock divider 11 is connected to two variable delay components VDC1 12 and VDC2 13.

VCD1 12 is connected, via connector C1 21, to first logic gate G1 24. The output of G1 24 is connected to one end of conductor C11 31. The other end of conductor C11 31 is connected to three different clock tree taps. One clock tree tap includes conductor C16 36. Another clock tree tap includes conductors C14 34 and C15 35. A further clock tree tap includes conductors C14 34, C13 33 and C12 32. Conductor C12 32 ends at clock tree edge 271. Conductor C15 35 ends at clock tree edge 272. Conductor C16 36 ends at clock tree edge 273.

VCD2 13 is connected, via connector C2 22, to second logic gate G2 25. The output of G2 25 is connected to one end of conductor C21 41. The other end of conductor C21 41 is connected to three different clock tree taps. One clock tree tap includes conductor C26 46. Another clock tree tap includes conductors C24 44 and C25 45. A further clock tree tap includes conductors C24 44, C23 43 and C22 42. Conductor C22 42 ends at clock tree edge 274. Conductor C25 45 ends at clock tree edge 275. Conductor C26 46 ends at clock tree edge 276.

The second clock divider 11' is connected to variable delay component VDC3 14. VCD3 14 is connected, via connector C3 23, to the third logic gate G3 26. The output of G3 26 is connected to one end of conductor C31 51. The other end of conductor C31 51 is connected to three different clock tree taps. One clock tree tap includes conductor C36 56. Another clock tree tap includes conductors C34 54 and C35 55. A further clock tree tap includes conductors C34 54, C33 53 and C32 52. Conductor C32 52 ends at clock tree edge 277. Conductor C35 55 ends at clock tree edge 278. Conductor C36 56 ends at clock tree edge 279.

These different conductors (and gates) define multiple clock paths. These clock paths can be viewed as belonging to three different clock path groups, one group per variable delay component. A first group of clock paths includes three clock paths that are defined between variable delay component VDC1 21 and clock tree edges 271, 272 and 273. A second group of clock paths includes three clock paths that are defined between variable delay component VDC2 23 and clock tree edges 274, 275 and 276. A third group of clock paths includes three clock paths that are defined between variable delay component VDC3 14 and clock tree edges 277, 278 and 279. The variable delay components can compensate for clock skews between the various groups of clock paths.

Conveniently, these different paths can cause a non-negligible non-common clock skews. In other words, the variable delay components are located at locations that define long non-common paths with the edges 271-279 of clock tree 210.

Conveniently, the clock tree portion 211 is designed such that its taps are short (introduce only short insertion delay, if any). Thus, the variable delay components can be placed before the clock tree taps.

Figure 4:
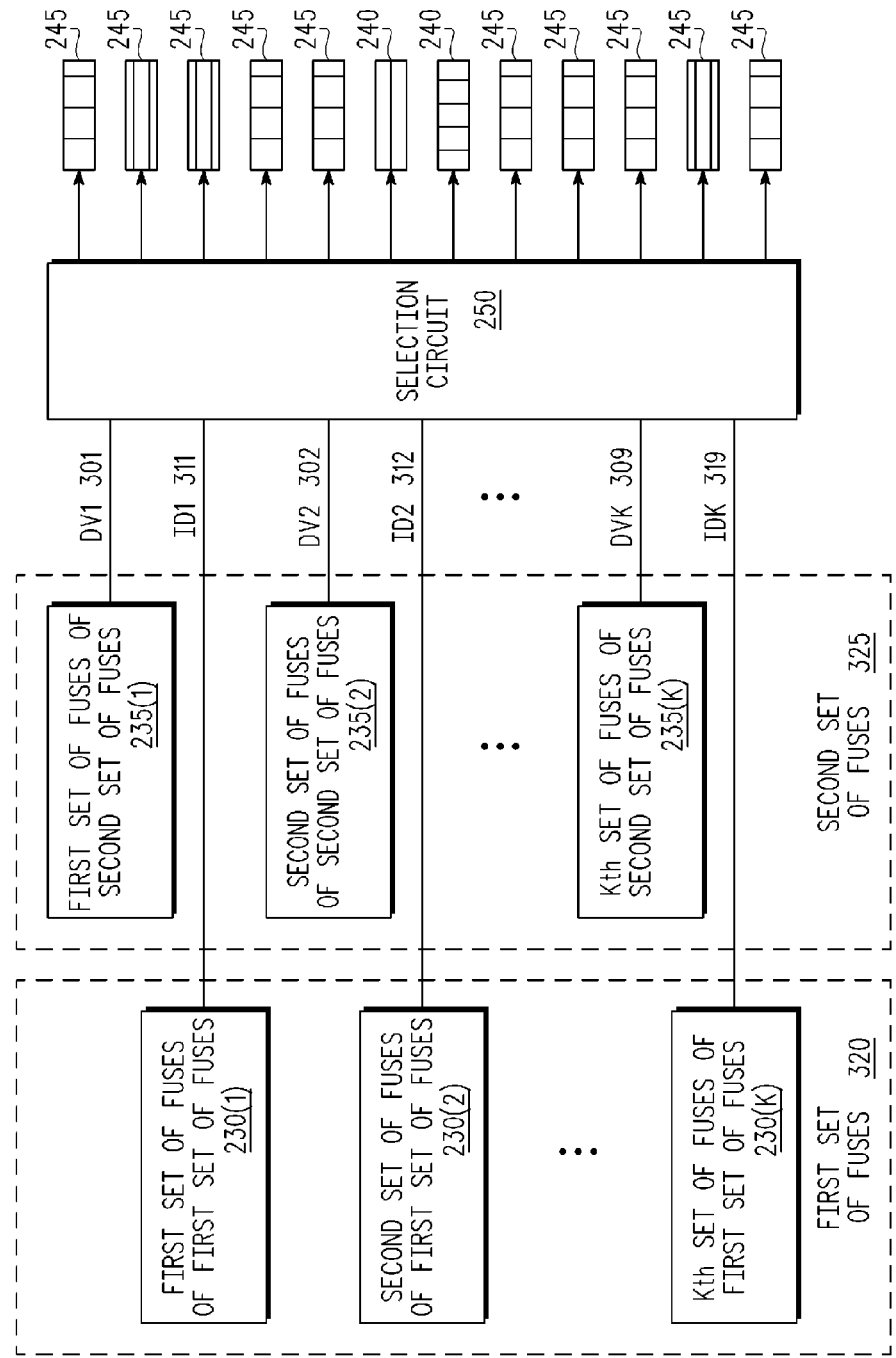
FIG. 4 is a schematic diagram of a multiple fuses, a selection circuit and multiple variable delay components, according to an embodiment of the invention.

FIG. 4 is a schematic diagram of a multiple fuses 239(1)-230(K) and 235(1)-235(K), a selection circuit 250 and multiple variable delay components 240 and 245, according to an embodiment of the invention. K is a positive integer. Index k ranges between 1 and k.

The first set of fuses 230 includes K fuse subsets 230(1)-230(K) and the second set of fuses 235 includes K fuse subsets 235(1)-235(K). Fuse subset 230(k) is associated with fuse subset 235(k). Fuse subset 250(k) indicates an identity of a variable delay component that is going to be set to a delay indicated by the fuse subset 235(k).

Selection circuit 250 receives K identities of selected variable delay units ID1-IDK 311-319, as well K delay values DV1-DVK 301-309. The selection circuit 250 can be connected to all the variable delay components. It provides the delay values to the first set of variable delay components 240 and can provide a default value to the other variable delay components. It is noted that the default value provided by the selection circuit can determine the default delay value but this is not necessarily so. According to an embodiment of the invention the default delay value of various variable delay components can by locally set (for example by using pull-up and/or pull-down circuits), and the default value provided by the selection circuit does not change the locally set default delay value. According to another embodiment of the invention the default value can be stored by a group of fuses, but this is not necessarily so.

Figure 5:
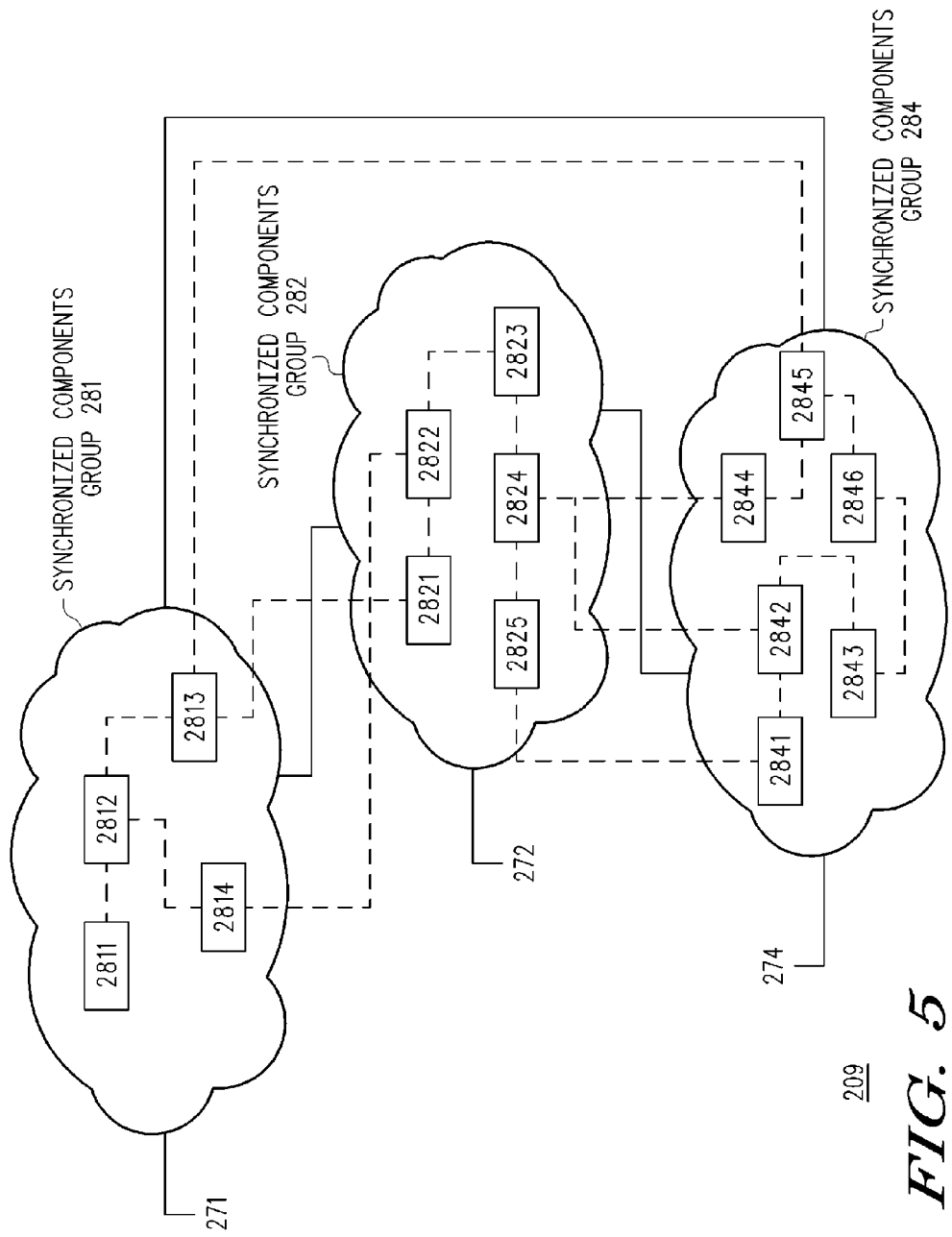
FIG. 5 is a schematic diagram of a portion of a system, according to an embodiment of the invention.

FIG. 5 is a schematic diagram of a portion 209 of system 200, according to an embodiment of the invention.

Portion 209 include three synchronized components groups 281-284. Each group can include one or more synchronized components that receive substantially the same clock signal. Each synchronized component group is connected to one edge of the clock tree. Synchronized components group 281 is connected to clock tree edge 271. Synchronized components group 282 is connected to clock tree edge 272. Synchronized components group 284 is connected to clock tree edge 274.

For convenience of explanation only few components and few connections between the components are illustrated in FIG. 5. Synchronized components group 281 includes synchronized components 2811, 2812, 2813 and 2814. Synchronized components group 282 includes synchronized components 2821, 2822, 2823, 2824 and 2825. Synchronized components group 284 includes synchronized components 2841, 2842, 2843, 2844, 2845 and 2846.

Synchronized component 2811 is connected to synchronized component 2812. Synchronized component 2812 is also connected to synchronized components 2813 and 2814.

Synchronized component 2811 is connected to synchronized component 2812. Synchronized component 2813 is also connected to synchronized components 2821 and 2845. Synchronized component 2814 is also connected to synchronized component 2822. Synchronized component 2821 is also connected to synchronized component 2822. Synchronized component 2822 is also connected to synchronized component 2823. Synchronized component 2823 is also connected to synchronized component 2824. Synchronized component 2824 is also connected to synchronized components 2825, 2842 and 2844. Synchronized component 2825 is also connected to synchronized component 2841. Synchronized component 2841 is also connected to synchronized component 2842. Synchronized component 2842 is also connected to synchronized component 2843. Synchronized component 2843 is also connected to synchronized component 2846. Synchronized component 2846 is also connected to synchronized component 2845. Synchronized component 2845 is also connected to synchronized component 2844.

These synchronized components define multiple operational paths. Some of these paths include synchronized components of the same synchronized components group while other paths include synchronized components from different synchronized components groups. The latter are usually subjected to clock skews and timing problems.

These operational paths are tested by various tests, such as static timing analysis, in order to determine timing problems as well as do define timing skews between different branches (paths) of the clock tree.

The static timing analysis can provide the timing differences between clock signals. These timing differences can be expressed by hold violations. The value of hold violations was defined by monitoring paths that passed or failed the static timing analysis with increased hold time positive slacks.

The inventors sorted the results of the static timing analysis according to the values of the positive slacks and selected the positive slack of the first path that passed the static timing analysis as the value of the hold timing violation. This value reflects the relative timing difference that should be introduced between different clock paths.

Thus, if the timing differences between a clock path that ends at clock tree edge 271 and between another clock path that ends at clock tree edge 272 is X microseconds, then the variable delay components should be set to values that differ by this amount.

Because there are many different clock paths and many variable delay components, a change in some variable delay components can cause new timing violations. Thus, knowing the timing differences between different clock trees can still require a very large number of variable delay component setting iterations.

According to an embodiment of the invention additional information can be provided. This additional information indicates the timing margins—the maximal (or substantially maximal) timing variations introduced by a certain variable delay component that will not introduce timing violations. These margins are also referred to as allowed timing differences or as negative timing slack.

Figure 6:
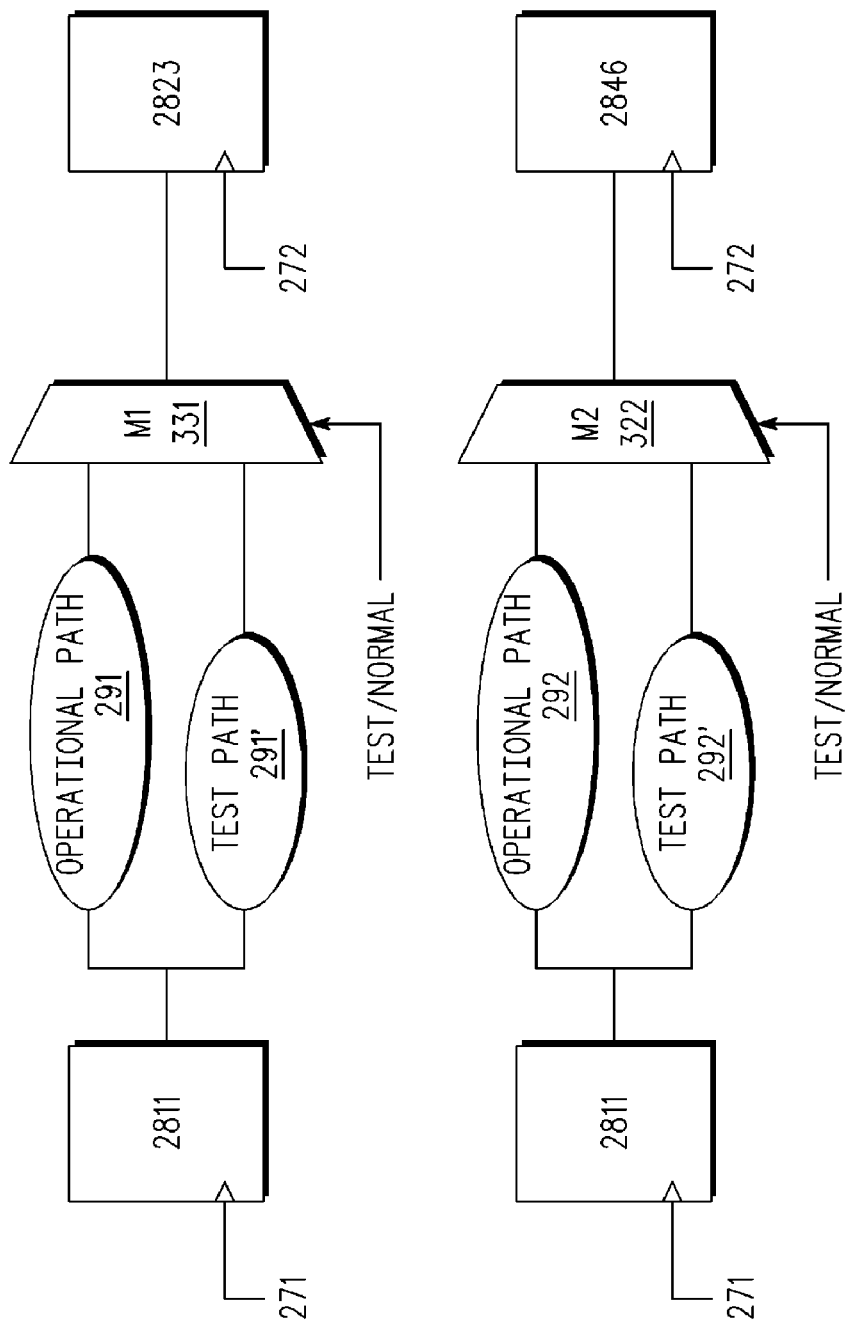
FIG. 6 is a schematic diagram of various synchronized components and paths, according to an embodiment of the invention.

FIG. 6 is a schematic diagram of various synchronized components 2811, 2823 and 2846 and paths 291, 292, 291' and 292', according to an embodiment of the invention.

The upper portion of FIG. 6 illustrates two synchronized components such as flip-flops 2811 and 2823, an operational path 291, a timing test path 291' and a multiplexer M1 331.

Multiplexer M1 331 selects which path out of operational path 291 and test path 291' is connected between flip-flops 2811 and 2823. During "normal" mode of system 200 M1 331 selects operational path 291. During test mode M1 331 selects (in response to a TEST/NORMAL signal) test path 291'. Signal TEST/NORMAL is provided to M1 and M2 331 and 332 by a testing component that can be long to system 200 or is connected to system 200.

Operational path 291 can include, for example, synchronized components 2812, 2813, 2821 and 2822. Yet for another example, operational path 291 can include synchronized components 2812, 2814 and 2822.

Test path 291' is designed so that it has a shorter delay than the delay of operational path 291. The difference between these delays is also referred to as delay difference. This shorter delay can assist in evaluating the amount of timing corrections that can be introduced without causing timing violations.

The lower portion of FIG. 6 illustrates two synchronized components such as flip-flops 2811 and 2846, an operational path 292, a timing test path 292' and a multiplexer M2 332.

Multiplexer M2 332 selected which path out of operational path 292 and test path 292' is connected between flip-flops 2811 and 2846. During "normal" mode of system 200 operational path 292 is selected, while during test mode the test path 292' is selected. Operational path 292 can include, for example, synchronized components 2812, 2813 and 2845. Yet for another example, operational path 292 can include synchronized components 2814, 2822, 2823, 2824 and 2845.

Test path 292' is designed so that it has a shorter delay than the delay of operational path 292. This shorter delay can assist in evaluating the amount of timing corrections that can be introduced without causing timing violations.

It is noted that multiple test paths that have different delay differences. These test paths can be connected in parallel to the test path.

According to an embodiment of the invention many pairs of synchronized components groups are connected by multiple operational paths. Each of these operational paths can be associated with one or more test paths that are characterized by delay differences that differ from each other. The delay differences of test path associated with different operational paths also differ from test path to test path.

For example, assuming that negative slacks of $\Delta T_1$, $\Delta T_2 \ldots \Delta T_J$ should be evaluated for each operational path. According to an embodiment of the invention J test pats are defined for each operational paths. These J test paths can be connected in parallel to each other, thus up to J timing iterations can be required for determining the allowable timing corrections.

If, on the other hand there are Q different operational paths are defined between synchronized components that belong to a certain pair of synchronized components groups then the J different test paths can be distributed among the Q different operational paths. Thus, less then J different iterations can be required for determining the allowable timing corrections.

For example, multiple operational paths exist between synchronized components group 281 and between synchronized components group 284. Each operational path can be associated with one or more test paths. Each of those test paths can be designed so that to provide a different delay difference. TABLE 1 illustrates various operational paths and the timing differences associated with their test paths. It is assumed that six different delay differences are tested (J=6).

TABLE 1

| Synchronized components included within an operational path between synchronized components 2811 and 2846 | Test path | Delay difference |
|---|---|---|
| 2812, 2813, 2845 | $TP_1$ | $\Delta T_1$ |
| 2812, 2813, 2845 | $TP_2$ | $\Delta T_2$ |
| 2812, 2813, 2821, 2822, 2823, 2824, 2825, 2841, 2842, 2843 | $TP_3$ | $\Delta T_3$ |
| 2812, 2813, 2821, 2822, 2823, 2824, 2825, 2844, 2845 | $TP_4$ | $\Delta T_4$ |
| 2812, 2814, 2822, 2823, 2824, 2844, 2845 | $TP_5$ | $\Delta T_5$ |
| 2812, 2814, 2822, 2823, 2824, 2844, 2845 | $TP_6$ | $\Delta T_6$ |

It is noted that the delay differences are defined between a test path and an associated operational path. As up to two test paths are associated with a single operational path TABLE 1 illustrates a scenario in which two iterations are required to determine the allowable timing corrections.

It is noted that the result of timing tests of multiple test paths provides a set of required timing adjustments as well as timing margins. The resolution of these constraints leads to a selection of the variable delay components that shall belong to the first set of variable delay components and also determines the delay values of these selected variable delay components.

Figure 7:
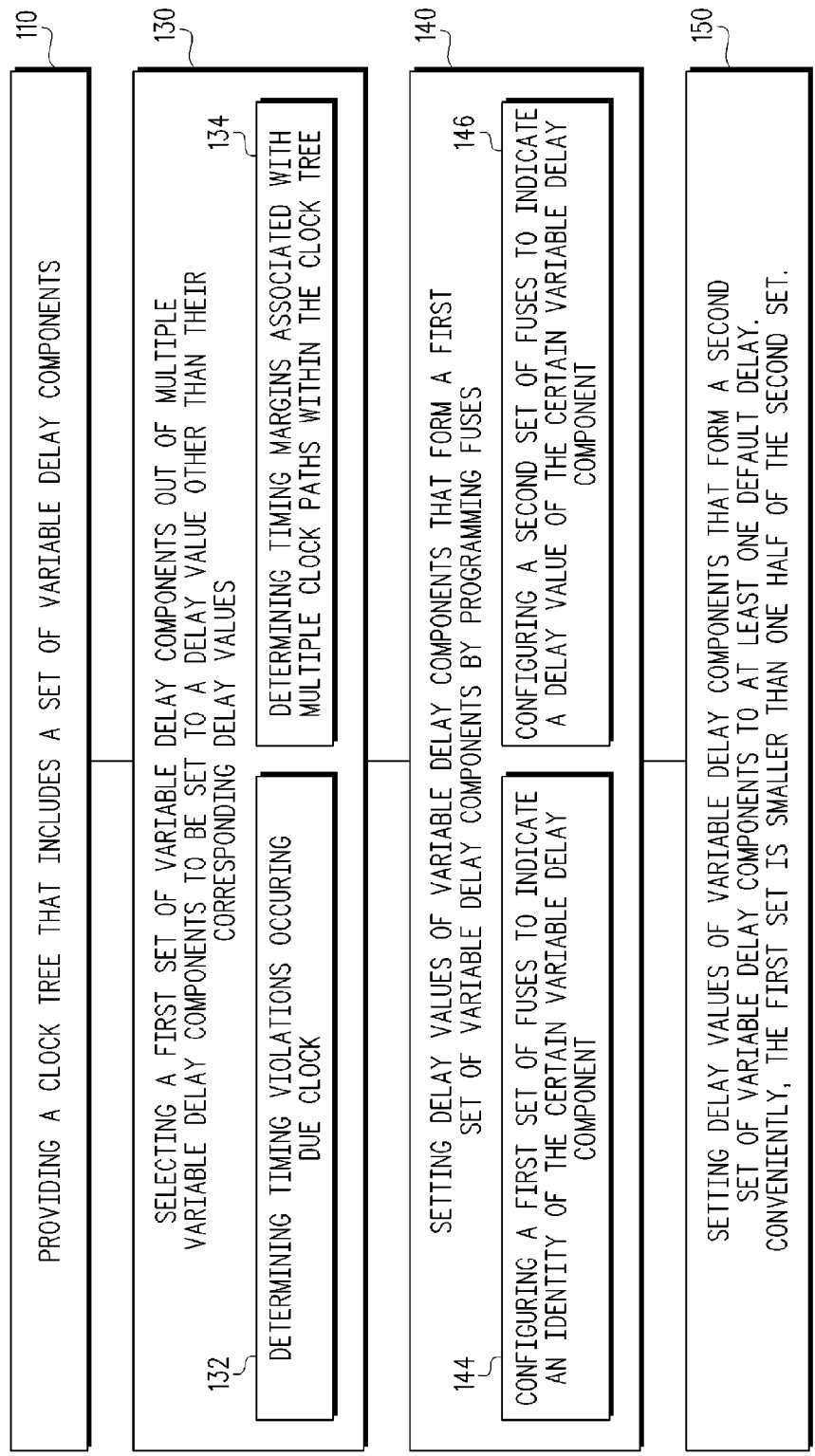
FIG. 7 is a flow chart of a method for reducing clock skew, according to an embodiment of the invention.

FIG. 7 is a flow chart of method 100 for reducing clock skews according to an embodiment of the invention.

Method 100 starts by stage 110 of providing a clock tree that includes a set of variable delay components. This clock tree can includes portions such as portion 211 of FIG. 3.

Stage 110 is followed by stage 130 of selecting a first set of variable delay components out of multiple variable delay components to be set to a delay value other than their corresponding delay values. Referring to the example set forth in previous FIGS. stage 130 includes selecting the variable delay components that will form the first set of variable delay components 240.

According to an embodiment of the invention stage 130 can include stage 132 of determining timing violations occurring due clock skews.

According to an embodiment of the invention stage 130 can be defined as selecting 130 a first set of variable delay components out of multiple variable delay components to be set to a delay value other than their corresponding delay values, in view of timing violations occurring due clock skews.

Conveniently, stage 132 is followed by stage 134 of determining timing margins associated with multiple clock paths within the clock tree.

Stage 134 conveniently includes testing one or more test paths, whereas a delay of a test path is shorter than a delay of an operational path associated with the test path.

Conveniently, the testing includes performing static timing analysis of the operational paths.

Stage 130 is followed by stages 140 and 150. Stage 140 includes setting delay values of variable delay components that form a first set of variable delay components by programming fuses.

Conveniently, stage 140 of setting includes stages 144 and 146. Stage 144 includes configuring a first set of fuses to indicate an identity of the certain variable delay component. Referring to the example set forth in FIG. 4, this stage can include programming the first set of fuses 230 to indicate the identity of each selected variable delay component. Stage 146 includes configuring a second set of fuses to indicate a delay value of the certain variable delay component.

Stage 150 includes setting delay values of variable delay components that form a second set of variable delay components to at least one default value. Conveniently, the first set is smaller than one half of the second set.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for reducing clock skews, the method comprises:
   providing a clock tree including a plurality of variable delay components, each branch of the clock tree including a single variable delay component; and
   setting a corresponding delay value of each variable delay component included at a first set of the variable delay components comprising setting a delay value of a first variable delay component by configuring a first set of fuses to indicate an identity of the first variable delay component, and by configuring a second set of fuses to indicate a delay value of the first variable delay component, and setting a corresponding delay value of each variable delay component included at a second set of the variable delay components to at least one default value, wherein a number of variable delay components included at the first set is less than one half of a number of variable delay components included at the second set.

2. The method according to claim 1 wherein the setting is preceded by selecting the first set of variable delay components.

3. The method according to claim 2 wherein the selecting comprises determining timing violations occurring due to clock skews.

4. The method according to claim 2 wherein the selecting comprises determining timing margins associated with multiple clock paths within the clock tree.

5. The method according to claim 4 wherein the determining of timing margins comprises testing test paths, whereas a delay of a test path is shorter than a delay of an operational path associated with the test path.

6. The method according to claim 5 wherein the testing comprises performing static timing analysis of the test paths.

7. A method for reducing clock skews, the method comprises:
   providing a clock tree including a plurality of variable delay components, each branch of the clock tree including a single variable delay component;
   selecting a first set of variable delay components of the plurality of variable delay components in view of timing violations occurring due to clock skews;
   setting a corresponding delay value of each variable delay component included at the first set comprising setting a delay value of a first variable delay component by configuring a first set of fuses to indicate an identity the first variable delay component, and by configuring a second set of fuses to indicate a delay value of the first variable delay component; and
   setting a corresponding delay value of each variable delay component included at a second set of variable delay components of the plurality of variable delay components to at least one default value.

8. The method according to claim 7 wherein selecting comprises determining timing violations occurring due to clock skews.

9. The method according to claim 7 wherein selecting comprises determining timing margins associated with multiple clock paths within the clock tree.

10. The method according to claim 9 wherein determining timing margins comprises testing test paths, and wherein a delay of a test path is shorter than a delay of an operational path associated with the test path.

11. The method according to claim 10 wherein testing comprises performing static timing analysis of the test paths.

12. The method according to claim 7 wherein providing comprises providing variable delay components at locations that define long non-common paths with edges of the clock tree.

13. A system, comprising:
    a clock tree including multiple variable delay components including a first set and a second set of variable delay components, each branch of the clock tree including a single variable delay component;
    a first set of fuses coupled to the multiple variable delay components to identify variable delay components included at the first set of variable delay components; and
    a second set of fuses coupled to the multiple variable delay components to identify a corresponding delay value associated with each variable delay component included at the first set of variable delay components, a corresponding delay value of each variable delay component included at the second set of variable delay components being set to at least one default delay value.

14. The system according to claim 13 further comprising a selection circuit coupled to the first set of fuses, wherein the selection circuit is to send each variable delay component included at the first set of variable delay components a delay value of that variable delay component.

15. The system according to claim 13 wherein a number of variable delay components included at the first set of variable delay components is less than one half of a number of variable delay components included at the second set of variable delay components.

16. The system according to claim 13 further comprising multiple test paths wherein a delay of a test path is shorter than a delay of an operational path associated with the test path.

17. The system according to claim 13 wherein the variable delay components that belong to the first set of variable delay components and to the second set of variable delay components are located at locations that define long non-common paths with edges of the clock tree.

18. The system according to claim 13 wherein a number of variable delay components included at the first set of variable delay components is less than one sixth of a number of variable delay components included at the second set of variable delay.

* * * * *